(12) United States Patent
Kim et al.

(10) Patent No.: US 7,236,041 B2
(45) Date of Patent: Jun. 26, 2007

(54) ISOLATED GATE DRIVER CIRCUIT FOR POWER SWITCHING DEVICES

(75) Inventors: Sangsun Kim, San Jose, CA (US); Wei Chen, Campbell, CA (US)

(73) Assignee: Monolithic Power Systems, Inc., San Jose, CA (US)

( * ) Notice: Subject to any disclaimer, the term of this patent is extended or adjusted under 35 U.S.C. 154(b) by 145 days.

(21) Appl. No.: 11/194,952

(22) Filed: Aug. 1, 2005

(65) Prior Publication Data

US 2007/0025123 A1    Feb. 1, 2007

(51) Int. Cl.
*H03K 17/687*    (2006.01)
(52) U.S. Cl. ...................... 327/434; 327/110
(58) Field of Classification Search ........ 327/110, 327/423, 427, 434, 443
See application file for complete search history.

(56) References Cited

U.S. PATENT DOCUMENTS

| | | | |
|---|---|---|---|
| 6,271,709 B1 * | 8/2001 | Kimura et al. | 327/380 |
| 6,333,665 B1 * | 12/2001 | Ichikawa | 327/434 |
| 6,441,652 B1 * | 8/2002 | Qian | 327/108 |
| 6,538,479 B2 * | 3/2003 | Bellomo et al. | 327/108 |
| 6,538,481 B1 * | 3/2003 | Suetsugu | 327/109 |
| 6,836,161 B2 * | 12/2004 | Akiyama et al. | 327/108 |

* cited by examiner

*Primary Examiner*—My-Trang Nuton
(74) *Attorney, Agent, or Firm*—Perkins Coie LLP; Zhou Lu

(57) ABSTRACT

Embodiments of isolated gate driver circuits are disclosed for driving high- and low-side switching devices for half- and full-bridge power converter topology. Disclosed circuits provide sufficient dead-time, operate over a wide range of duty cycles, and require a single power supply ($V_{cc}$). Typical applications for such circuits include cold cathode fluorescent lamp (CCFL) inverters that are powered by a high voltage DC rail.

22 Claims, 11 Drawing Sheets

Isolated gate driving circuit I for power MOSFET.

Isolated gate driving circuit I for power MOSFET.

Transformer secondary winding voltage according to duty cycle.

Operational waveforms.

Isolated gate driving circuit II for power MOSFET.

Isolated gate driving circuit III for power MOSFET.

Isolated gate driving circuit IV for power MOSFET.

Isolated gate driving circuit V for power MOSFET.

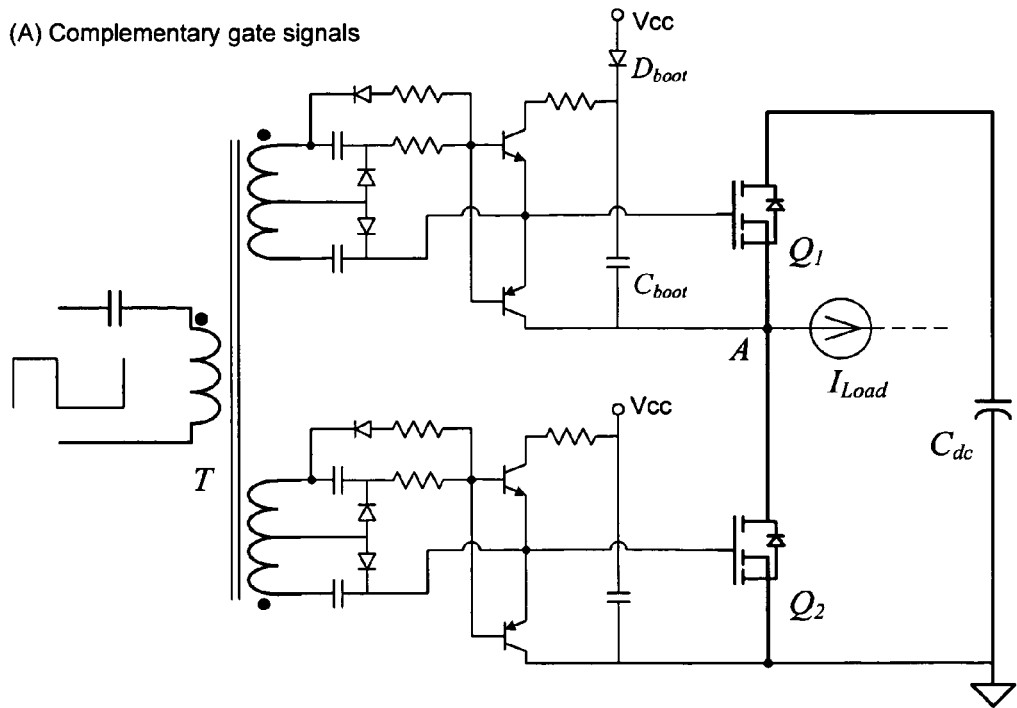
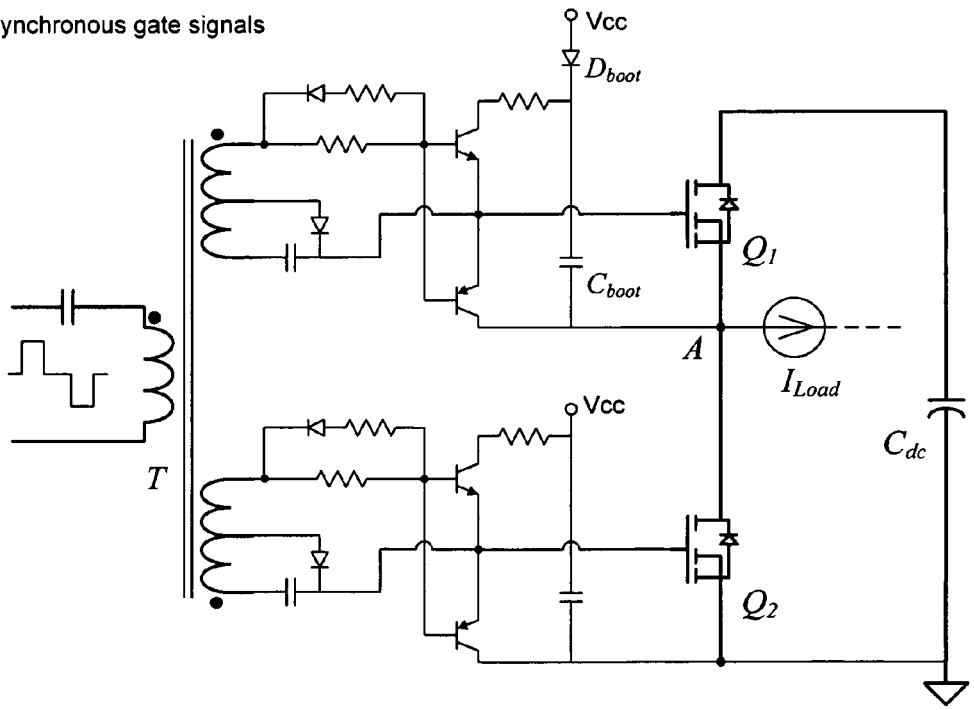
FIG. 8  Isolated gate driver circuit for half-bridge topology.

Transient waveforms of top and bottom gate signals with complementary gate signals.

Synchronous gate signals.

Full bridge gate drive circuit with a single isolated transformer.

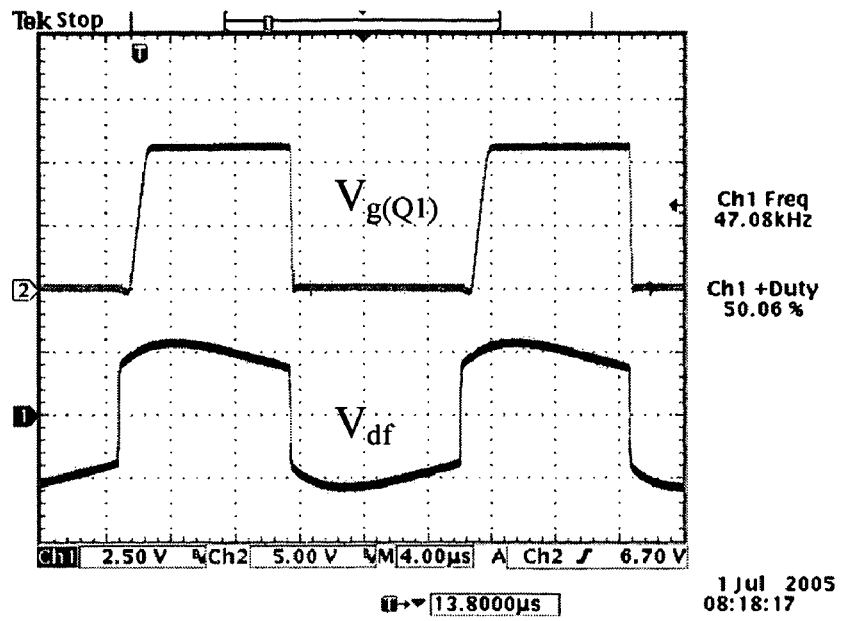
(a) 50% duty cycle
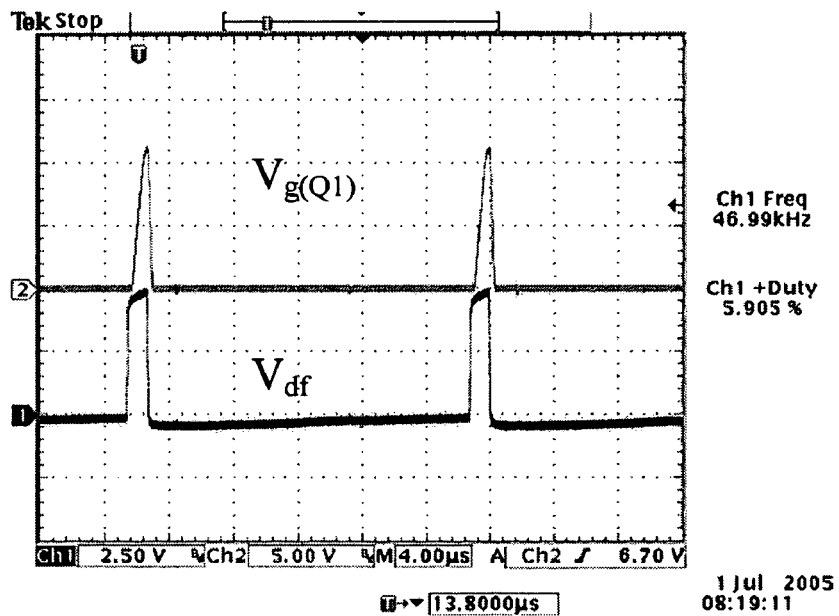
(b) 5% duty cycle
Secondary winding voltages.
*FIG. 12*

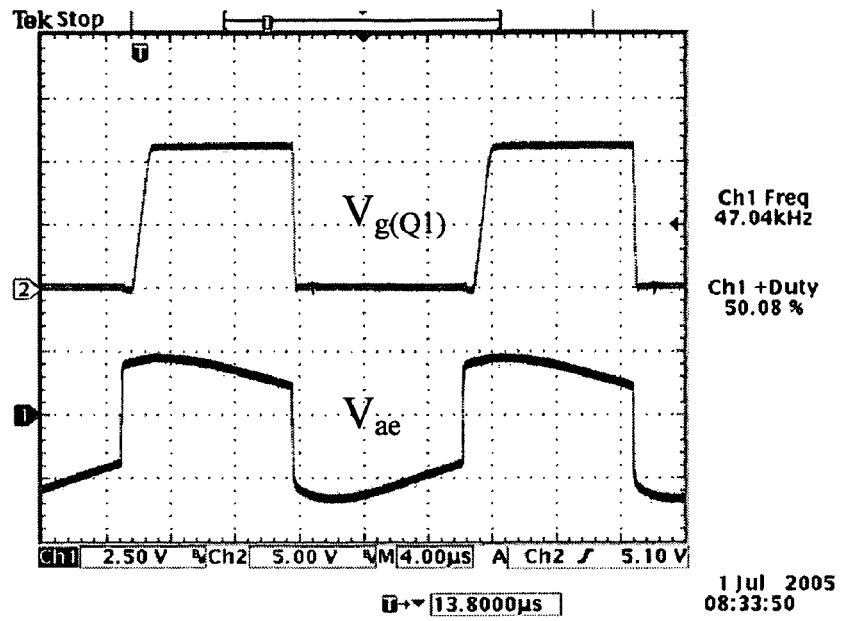
(a) 50% duty cycle
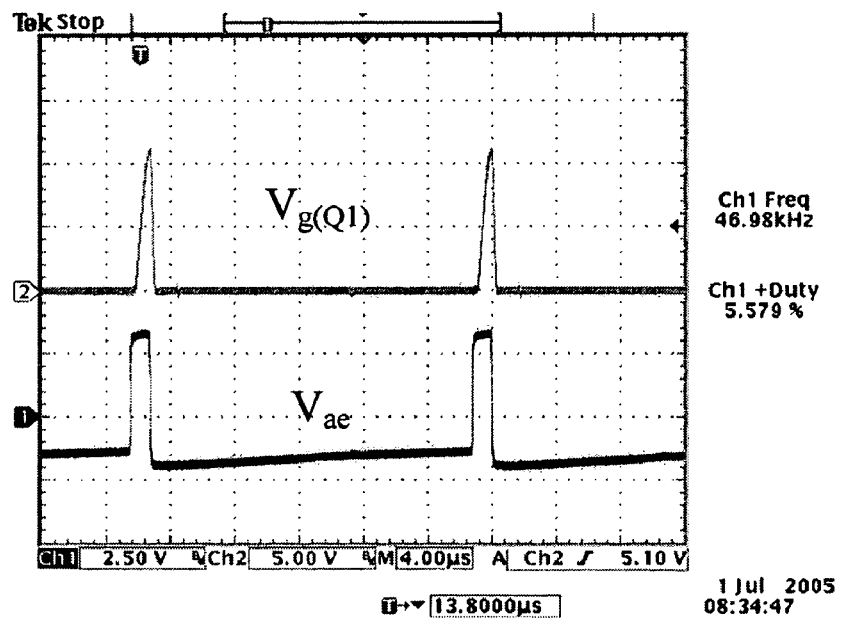
(b) 5% duty cycle
Transistor driving voltages.
FIG. 13

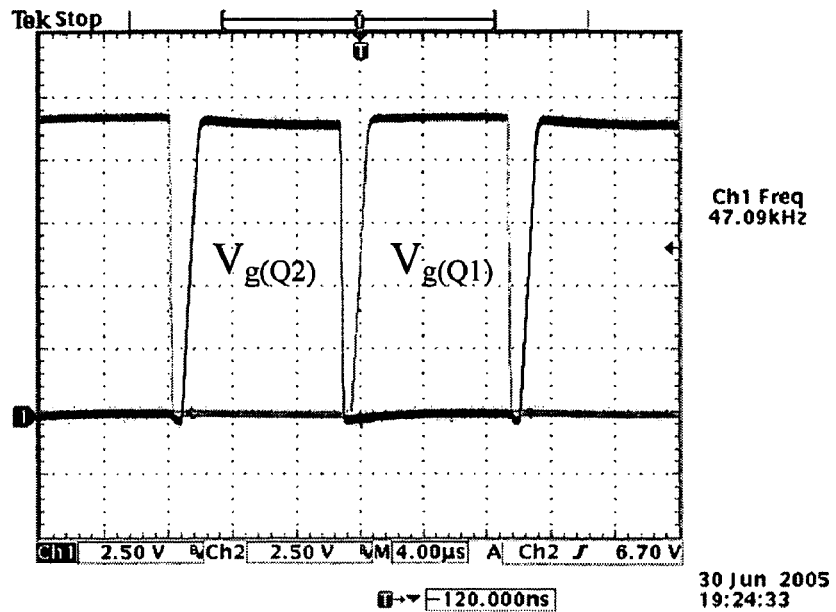
(a) 50% duty cycle
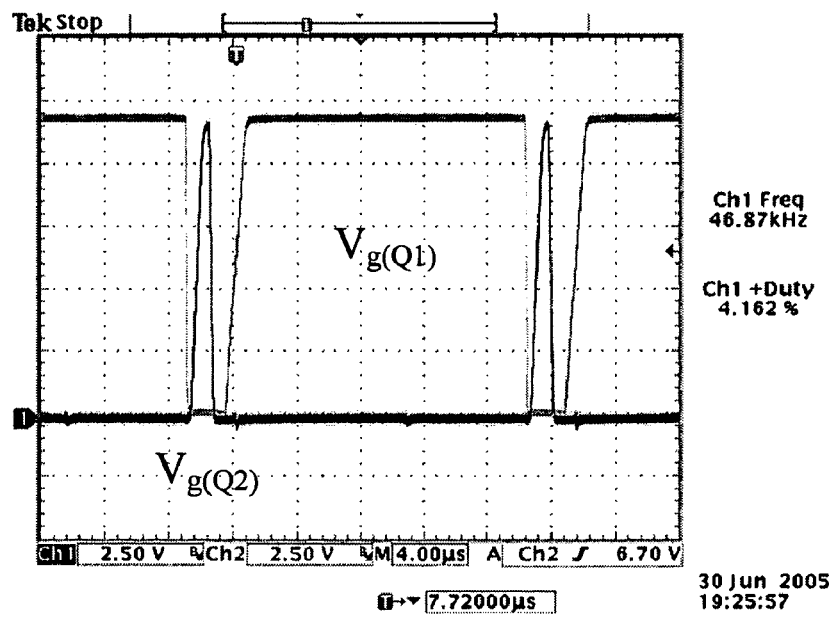
(b) 5% duty cycle
Top and bottom gate voltages with complementary gate signals.
*FIG. 14*

Top and bottom gate voltages with synchronous gate signals.

ISOLATED GATE DRIVER CIRCUIT FOR
POWER SWITCHING DEVICES

TECHNICAL FIELD

The embodiments described below relate, generally, to an integrated circuit gate driver for driving MOS-gated power devices and, particularly, to drivers that prevent the simultaneous turn-on of high side and low side IGBT (insulated gate bipolar transistor) devices.

BACKGROUND

Power switching devices having a capacitive gate control input such as MOSFETs, insulated gate bipolar transistors (IGBTs), and MOS-controlled thyristors (MCTs), are used in a multitude of electronic switching applications such as ON/OFF load controls, switching amplifiers, motor drivers, switch mode power supplies (SMPSs), and cycloconverters for their superior performance at high switching frequencies. Such devices are turned on by charging the gate capacitance to some appropriate, relatively low, voltage value and are turned off by discharging the gate capacitance. Information as to when the power switching device is to be on and off is delivered to a gate driver circuit which is designed to rapidly charge and discharge the gate capacitance of the power switching device as a means of turning the device on and off.

However, in circuits using high-side and low side MOS-gated devices, such as motor controllers, the two MOS-gated devices cannot be on at the same time, because it creates a direct short circuit known as "shoot-through" condition. A common application involves using two MOS power transistors stacked in series between two power supply rails as the output stage of a switching regulator, conventionally referred to as a "half-bridge" configuration. In a "shoot-through" condition, when both power switches are turned on at the same time, a low resistance path is created between the two power rails and a large current will flow through the two power switches. A shoot-through wastes power, can cause fluctuations in the power supply voltage, and/or can cause over-heating, which will damage the power switches.

BRIEF DESCRIPTION OF THE DRAWINGS

FIG. 8 shows an isolated gate driver for half-bridge topology.

FIG. 12 shows a transformer secondary winding voltages.

FIG. 13 shows the MOSFETs driving voltages with complementary gate signals.

FIG. 14 shows isolated gate voltages of the switching MOSFETs.

DETAILED DESCRIPTION

Various embodiments of the invention will now be described. The following description provides specific details for a thorough understanding and enabling description of these embodiments. One skilled in the art will understand, however, that the invention may be practiced without many of these details. Additionally, some well-known structures or functions may not be shown or described in detail, so as to avoid unnecessarily obscuring the relevant description of the various embodiments.

The terminology used in the description presented below is intended to be interpreted in its broadest reasonable manner, even though it is being used in conjunction with a detailed description of certain specific embodiments of the invention. Certain terms may even be emphasized below; however, any terminology intended to be interpreted in any restricted manner will be overtly and specifically defined as such in this Detailed Description section.

Embodiments of isolated gate driver circuits are disclosed for driving high- and low-side switching devices for a bridge type power converter topology (half and full bridge). Typical applications for such circuits include cold cathode fluorescent lamp (CCFL) inverter that is powered by a high voltage DC rail.

Driving of the high-side switch is challenging because the gate and the source of the MOSFET are floating. One method for driving MOSFETs is to use high voltage driver ICs; however, this approach is expensive. Disclosed embodiments of the gate drive circuits, comprising an isolated transformer and n- and p-channel transistors, are more cost effective and provide sufficient dead time and operate over a wide range of duty cycles.

Figure 1:
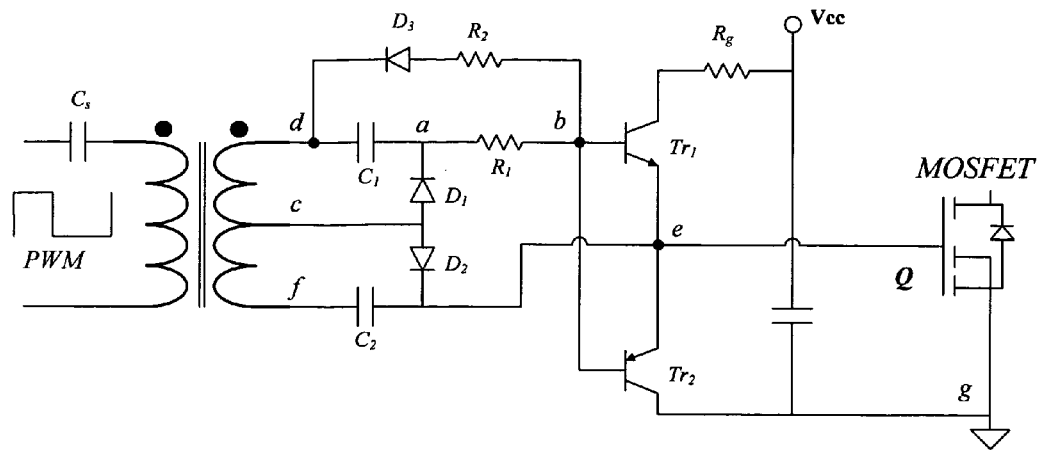
FIG. 1 illustrates an isolated gate driving circuit, in accordance with an embodiment of the invention.

FIG. 1 depicts an embodiment of an isolated gate driving circuit. The circuit of this embodiment consists of an isolated transformer, n- and p-channel transistors, and a switching power device (MOSFET). In this embodiment, a PWM control input signal is transferred through an isolated transformer. Here, Capacitor Cs is used to avoid a saturation of the transformer. Tr1 is a pull-up n-channel bipolar junction transistor (BJT) and provides high gate current through a switching device.

The gate resistor Rg is typically placed in front of the gate of a MOSFET. However, Rg is moved and is placed in series with the Tr1. In this configuration, the MOSFET gate discharge impedance will be lower. Tr2 is a pull-down p-channel BJT and is used to achieve fast turn-off time of the switching devices by providing a gate discharge path. Rg determines the MOSFET turn-on speed. Tr1 and/or Tr2 can be replaced by MOSFETs. The voltage to drive either Tr1 or Tr2 is very low so that the size of the transformer magnetic is smaller due to the lower required secondary voltage of the transformer. In order to turn on a MOSFET (Q), Tr1 is turned on and Tr2 is off. On the other hand, Q is turned off when Tr2 is on and Tr1 off. A diode D3 offers lower impedance path to turn on Tr2 or turn off Tr1. The off-time period is determined by the resistor R2 in series with diode D3.

Figure 2:
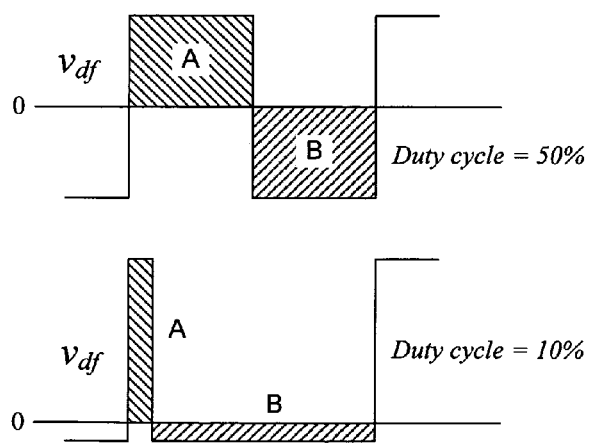
FIG. 2 shows secondary winding voltages of an isolated transformer, shown in FIG. 1, as a function of duty cycles.

FIG. 2 shows the secondary winding voltages of the isolated transformer shown in FIG. 1, as a function of duty cycles. Area A in FIG. 2 must be the same as area B. For a duty cycle close to 50% the secondary voltage is symmetrical, therefore the driving voltages for both Tr1 and Tr2 are high enough. But the secondary voltage associated with very low or high duty cycles, for example for duty cycles lower than 20% or higher than 80%, is not high enough to turn on either Tr1 or Tr2.

Figure 3:
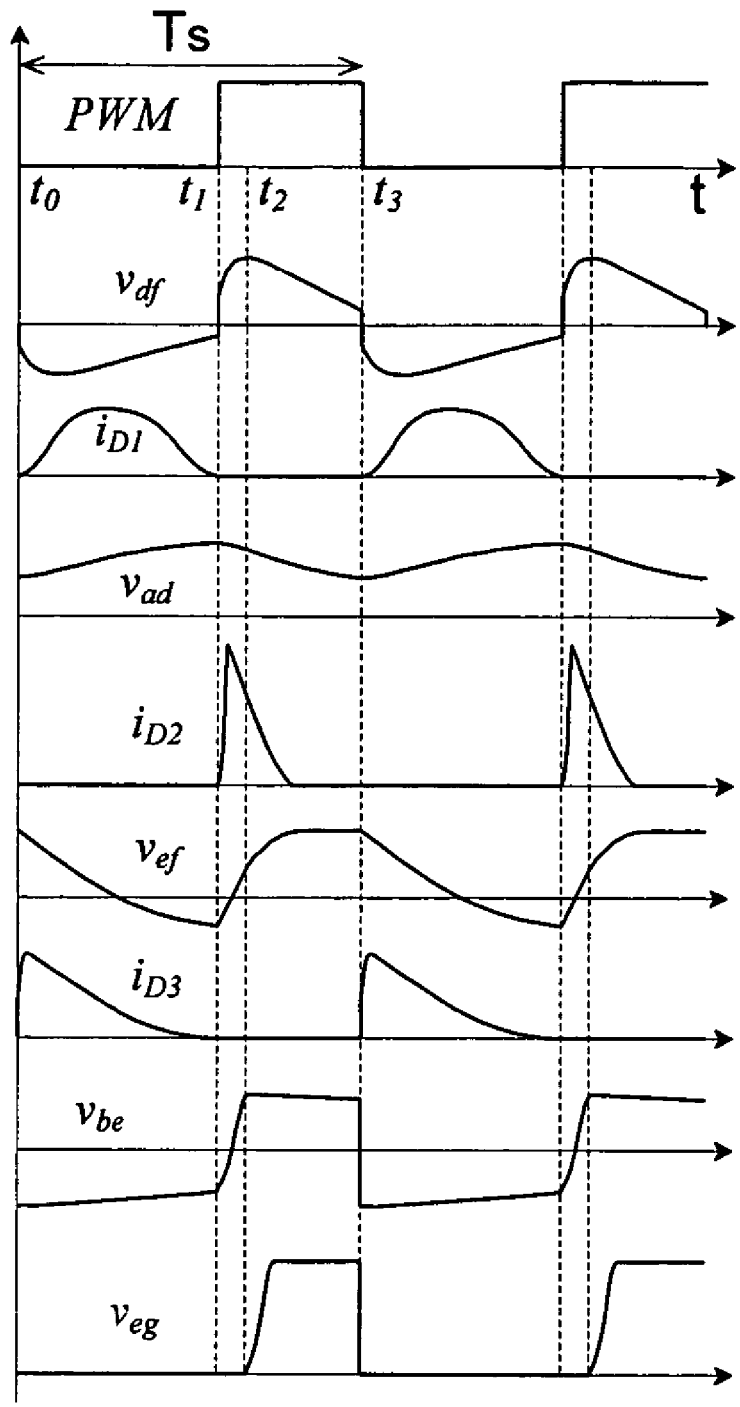
FIG. 3 shows operational waveform details of the gate driving circuit of FIG. 1.

Therefore, a DC offset is required by adding additional components C1, C2, D1, and D2. The transformer center-tap is connected to diodes D1, and D2. Capacitor C1 charges up during the switch-off period and helps turn Tr1 on while capacitor C2 charges up during the switch-on period and helps turn Tr2 on. As a result, the positive peak voltage of Vae (the voltage across points "a" and "e") is similar to the negative peak voltage of Vae, over a wide range of duty cycle. FIG. 3 shows the detail operational waveforms of the gate driving circuit of FIG. 1.

FIGS. 4 to 7 show alternative embodiments of the gate driving circuits with similarities to the gate driving circuit of FIG. 1. The gate driving circuits depicted in FIGS. 1, and 4 through 7 can be used with both half- and full-bridge topology using the two secondary windings of an isolated transformer.

FIG. 8 shows an embodiment of an isolated gate driver for half-bridge topology (e.g., two power transistors stacked in series between two power supply rails as the output stage of a switching regulator). In addition to the single gate driving circuit of FIG. 1, the isolation transformer of this embodiment has a single primary and two secondary windings with center-taps. In this embodiment, a bootstrap circuit is added for top switch Q1, and the half-bridge has two MOSFETs in series.

The two power switches Q1 and Q2 operate in complementary or synchronous modes so that a single PWM control signal can be employed for operating both switches. When Q1 is turned on, a positive ILoad current flows from Cdc through Q1 to Load. When Q2 is on, a negative ILoad current flows from Load through Q2. The bootstrap circuit includes capacitor Cboot and diode Dboot. The capacitor Cboot is charged whenever Q2 is turned on and is discharged during the on-state of Q1. By adding diode Dboot, no additional power supply is necessary for Q1. The circuit of FIG. 8A is preferable with a complementary signal whereas the circuit in FIG. 8B is preferable with a synchronous signal. Two separate isolated transformers for top and bottom MOSFETs can also be used instead of an integrated transformer with 2 secondary windings as shown in FIGS. 8A and 8B.

Figure 9:
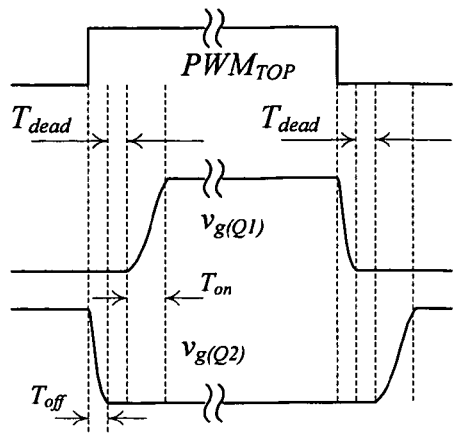
FIG. 9 shows transient waveforms of gate signals.

FIG. 9 shows transient waveforms of Q1 and Q2 gate signals with complimentary PWM mode. With a bridge configuration, a dead-time is essential to prevent a "shoot through" or cross-conduction current through the leg. Therefore, the turn-off time must be short and a turn-on delay is required. The dead-time (Tdead) is adjusted with the low resistance R2, and the relatively high resistance R1.

Figure 10:
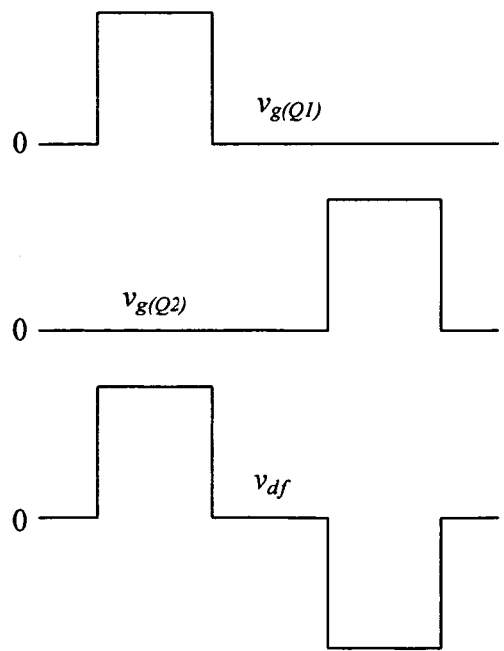
FIG. 10 shows synchronous gate drivers for both MOS-FETs.

FIG. 10 shows synchronous gate singles for top and bottom MOSFETs. Two power switches are either complimentary or synchronous so that a single isolated transformer can be used for both half- and full-bridge topologies. Vdf is the voltage across the secondary winding of the transformer.

Figure 11:
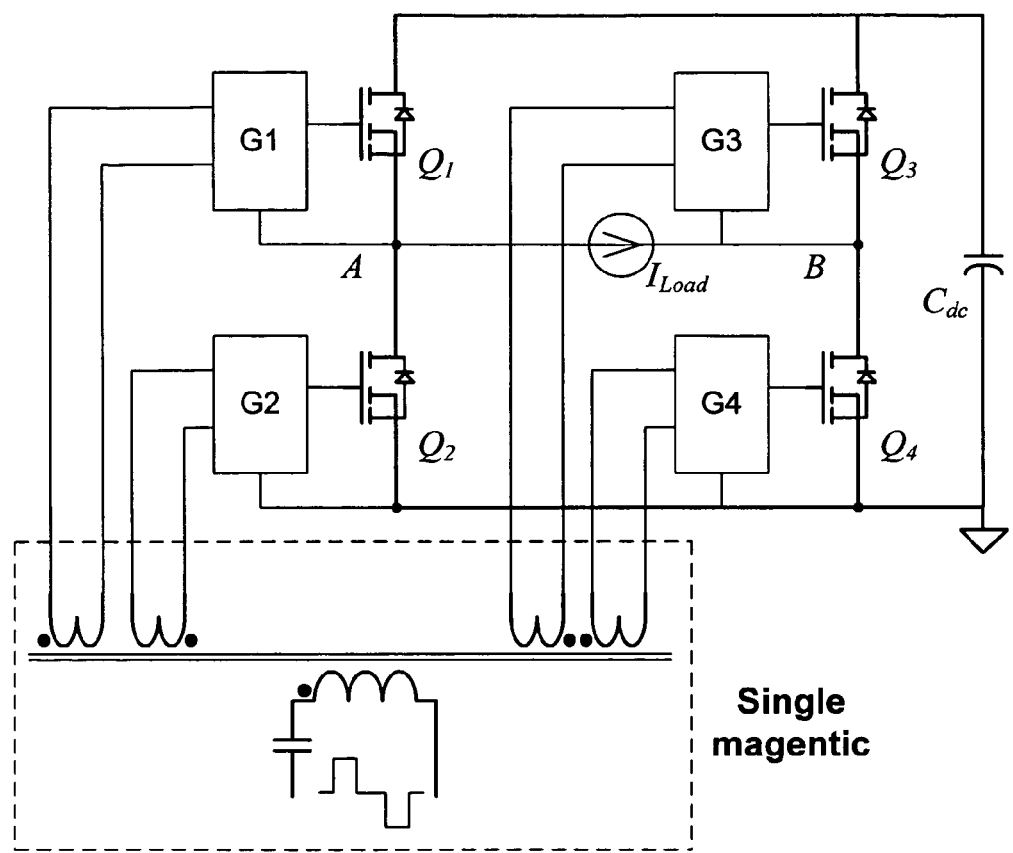
FIG. 11 shows a full-bridge gate drive circuit with a single isolated transformer for full-bridge topology.

FIG. 11 shows a full-bridge gate drive circuit with a single isolated transformer for full-bridge topology. A bootstrap circuit is added in a same manner as in the circuit of FIG. 8. The gate driving circuits in G1 through G4 may be any driving circuit disclosed above and shown in FIGS. 1 and 4 through 7. For example the circuit depicted in FIG. 4 may be used in G1 and G3, and the circuit depicted in FIG. 5 may be used in G2 and G4. The disclosed circuits provide sufficient dead-time, operate over a wide range of duty cycles, and require a single power supply (Vcc).

FIG. 12 shows the transformer secondary winding voltages. The negative peak voltage is not enough to turn on a p-channel MOSFET at low duty cycles.

FIG. 13 shows the transistor driving voltages with complementary gate signals. As depicted in FIG. 13, even at lower duty cycles, the negative peak voltage is enough to turn on the p-channel BJT and turn off the n-channel BJT.

Figure 4:
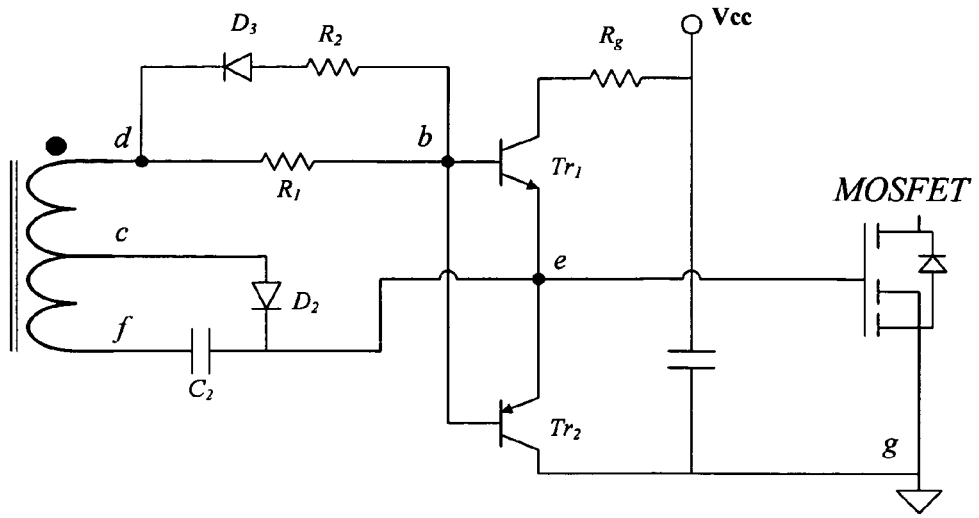
FIGS. 4 to 7 show gate driving circuits with similarities to the circuit of FIG. 1.
Figure 5:
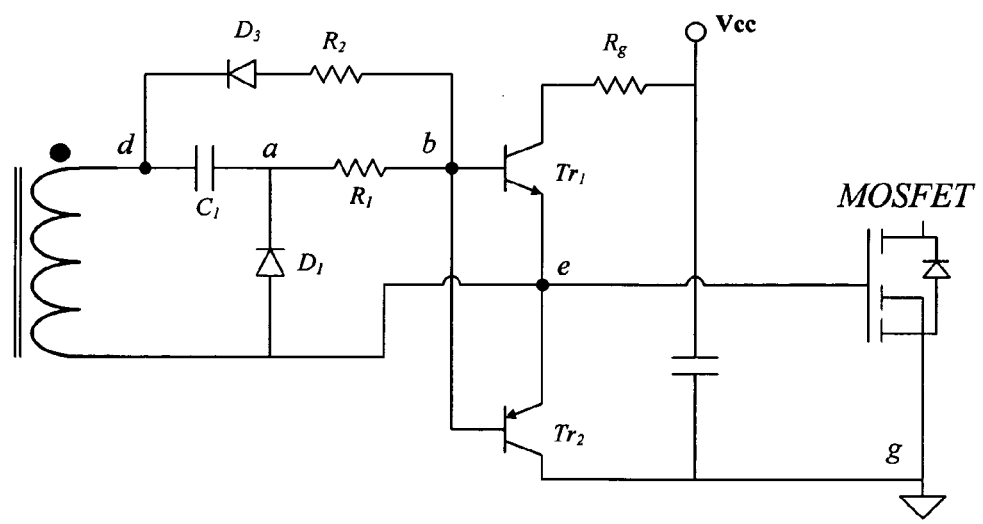
Figure 6:
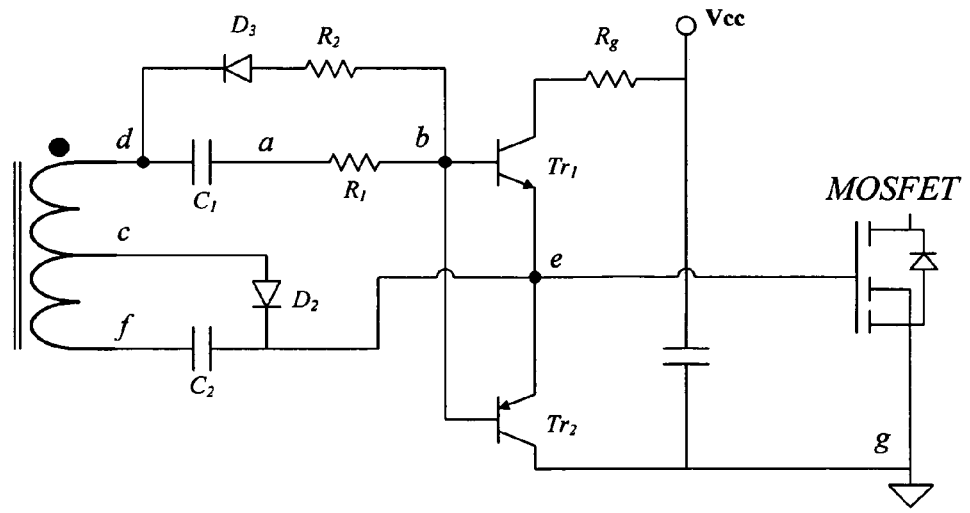
Figure 7:
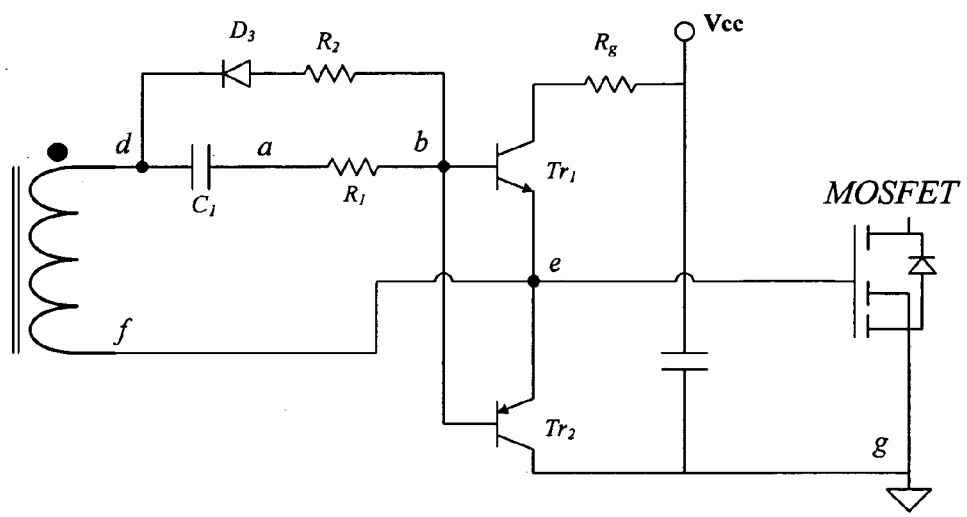

FIG. 14 shows isolated gate voltages of the switching MOSFETs shown in FIG. 4, with complementary gate signals. The voltage representative waveforms illustrate that the isolated gate driver circuit achieves sufficient dead-time and operates over a wide range of duty cycles.

Figure 15:
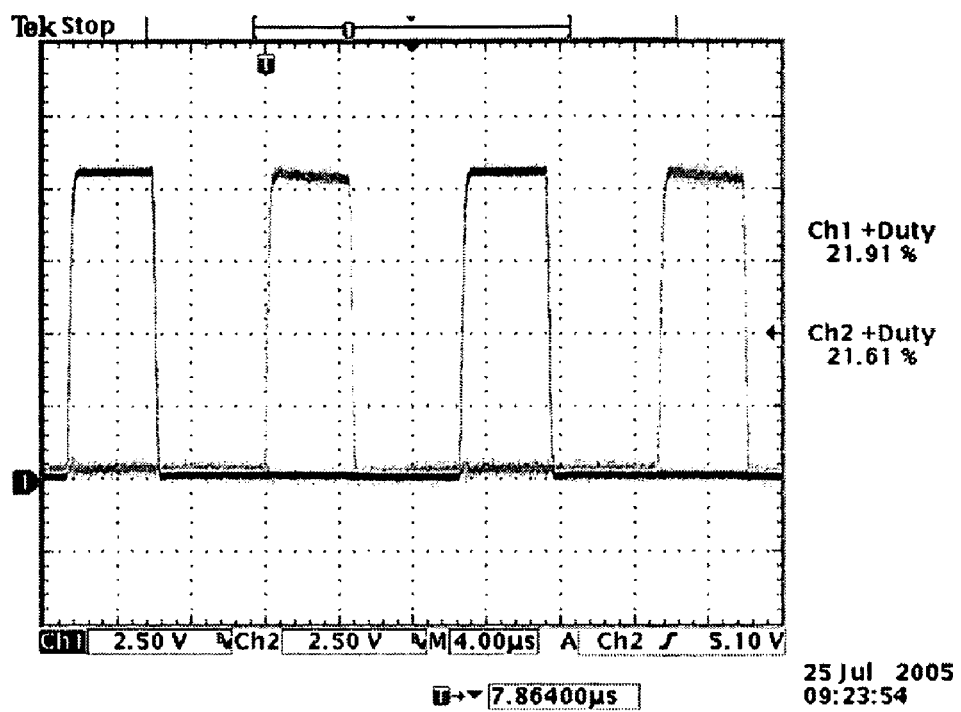
FIG. 15 illustrates gate voltages of the MOSFETs with synchronous gate signals.

FIG. 15 illustrates the gate voltages of the MOSFETs with synchronous gate signals.

It should be noted that BJT transistors can be replaced by FET transistors and resistors, capacitors, and diodes can be replaced by other resistive, capacitive, and unidirectional current elements, respectively.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof, means any connection or coupling, either direct or indirect, between two or more elements; the coupling of connection between the elements can be physical, logical, or a combination thereof.

Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize.

The teachings of the invention provided herein can be applied to other systems, not necessarily the system described above. The elements and acts of the various embodiments described above can be combined to provide further embodiments.

Changes can be made to the invention in light of the above Detailed Description. While the above description describes certain embodiments of the invention, and describes the best mode contemplated, no matter how detailed the above appears in text, the invention can be practiced in many ways. Details of the compensation system described above may vary considerably in its implementation details, while still being encompassed by the invention disclosed herein.

As noted above, particular terminology used when describing certain features or aspects of the invention should not be taken to imply that the terminology is being redefined herein to be restricted to any specific characteristics, features, or aspects of the invention with which that terminology is associated. In general, the terms used in the following claims should not be construed to limit the invention to the specific embodiments disclosed in the specification, unless the above Detailed Description section explicitly defines such terms. Accordingly, the actual scope of the invention encompasses not only the disclosed embodiments, but also all equivalent ways of practicing or implementing the invention under the claims.

While certain aspects of the invention are presented below in certain claim forms, the inventors contemplate the various aspects of the invention in any number of claim forms. Accordingly, the inventors reserve the right to add additional claims after filing the application to pursue such additional claim forms for other aspects of the invention

We claim:

1. Gate driver apparatus for charging and discharging a capacitive-gate control input of a power switching device utilized in a half- or a full-bridge circuit configuration operating with a wide range of duty cycles, the apparatus comprising:
   a transformer including a primary winding and a secondary winding;
   a DC-offset producing circuit connected to the secondary winding of the transformer, wherein the DC-offset producing circuit causes fast turn-on and turn-off of the power switching device;
   a pull-up-pull-down circuit including first and second complementary transistors connected to the DC-offset producing circuit, utilizing low driving voltage;
   a feedback circuit connecting a feedback port of the pull-up-pull-down circuit to a feedback port of the DC-offset producing circuit, wherein the feedback circuit; speeds up turn-off of the first transistor and turn-on of the second transistor; and
   a configuration wherein the pull-up-pull-down circuit controls the gate of the power switching device.

2. The gate driver apparatus of claim 1, wherein:
the DC-offset producing circuit comprises:
   a first charge storage element, connected from a first side of the storage element to a first end of the secondary winding;
   a first unidirectional current element, connected between a center tap of the secondary winding and the second side of the first charge storage element, wherein current flows through the first unidirectional current element from the center tap toward the first charge storage element;
   a second charge storage element connected from a first side of the storage element to a second end of the secondary winding; and
   a second unidirectional current element connected between the center tap of the secondary winding and the second side of the second charge storage element, wherein current flows through the second unidirectional current element from the center tap to the second charge storage element;
the pull-up-pull-down circuit comprises:
   the first and the second complementary transistor connected from a first side together, in series, wherein:
      the first transistor is connected from a second side of the transistor to a first end of a first resistive element;
      a second end of the first resistive element is connected to a power supply voltage;
      the second transistor is connected from a second side of the transistor to ground; and
      a third charge storage element is connected between the second side of the first resistive element and the second side of the second transistor;
the feedback circuit comprises:
   a second resistive element and a third unidirectional current element connected in series from the gates of the first and the second transistors to the first end of the secondary winding, wherein current flows toward the first end of the secondary winding; and
a configuration wherein:
   the gate of the power switching device is connected to the connection point of the first and the second transistors and to the second side of the second charge storage element; and
   a third resistive element is connected from a first side of the resistive element to the second side of the first charge storage element and from a second side of the resistive element to the gates of the first and the second transistors.

3. The gate driver apparatus of claim 2, wherein:
the secondary winding of the transformer has a center tap;
the first transistor is an n-channel bipolar junction transistor and the second transistor is a p-channel bipolar junction transistor and the emitter of the first transistor is connected to the emitter of the second transistor;
the power switching device is either BJTs or MOSFETs;
at least one of the charge storage elements is a capacitor;
at least one of the resistive elements is a resistor;
at least one of the unidirectional current elements is a diode;
the transformer is an isolated transformer, and
signals to the primary winding of the transformer is PWM complementary, synchronous, or both.

4. The gate driver apparatus of claim 1, wherein:
the DC-offset producing circuit comprises:
   a first charge storage element, connected from a first side of the storage element to a second end of the secondary winding; and
   a first unidirectional current element, connected between a center tap of the secondary winding and the second side of the first charge storage element, wherein current flows through the first unidirectional current element from the center tap toward the first charge storage element;
the pull-up-pull-down circuit comprises:
   the first and the second complementary transistor connected from a first side together, in series, wherein:
      the first transistor is connected from a second side of the transistor to a first end of a first resistive element;
      a second end of the first resistive element is connected to a power supply voltage;
      the second transistor is connected from a second side of the transistor to ground; and
      a third charge storage element is connected between the second side of the first resistive element and the second side of the second transistor;
the feedback circuit comprises:
   a second resistive element and a third unidirectional current element connected in series from the gates of the first and the second transistors to the first end of the secondary winding, wherein current flows toward the first end of the secondary winding; and
a configuration wherein:
   the gate of the power switching device is connected to the connection point of the first and the second transistors and to the second side of the first charge storage element; and
   a third resistive element is connected from a first side of the resistive element to the first end of the secondary winding and from a second side of the resistive element to the gates of the first and the second transistors.

5. The gate driver apparatus of claim 4, wherein:
the secondary winding of the transformer has a center tap;
the first transistor is an n-channel bipolar junction transistor and the second transistor is a p-channel bipolar junction transistor and the emitter of the first transistor is connected to the emitter of the second transistor;
the power switching device is either BJTs or MOSFETs;
at least one of the charge storage elements is a capacitor;
at least one of the resistive elements is a resistor;
at least one of the unidirectional current elements is a diode;
the transformer is an isolated transformer, and
signals to the primary winding of the transformer is PWM complementary, synchronous, or both.

6. The gate driver apparatus of claim 1, wherein:
the DC-offset producing circuit comprises:
  a first charge storage element, connected from a first side of the storage element to a first end of the secondary winding; and
  a first unidirectional current element connected between a second end of the secondary winding and the second side of the first charge storage element, wherein current flows through the first unidirectional current element from a second end of the secondary winding to the first charge storage element;
the pull-up-pull-down circuit comprises:
  the first and the second complementary transistor connected from a first side together, in series, wherein:
    the first transistor is connected from a second side of the transistor to a first end of a first resistive element;
    a second end of the first resistive element is connected to a power supply voltage;
    the second transistor is connected from a second side of the transistor to ground; and
    a third charge storage element is connected between the second side of the first resistive element and the second side of the second transistor;
the feedback circuit comprises:
  a second resistive element and a third unidirectional current element connected in series from the gates of the first and the second transistors to the first end of the secondary winding, wherein current flows toward the first end of the secondary winding; and
a configuration wherein:
  the gate of the power switching device is connected to the connection point of the first and the second transistors and to the second end of the secondary winding; and
  a third resistive element is connected from a first side of the resistive element to the second side of the first charge storage element and from a second side of the resistive element to the gates of the first and the second transistors.

7. The gate driver apparatus of claim 6, wherein:
the secondary winding of the transformer has a center tap;
the first transistor is an n-channel bipolar junction transistor and the second transistor is a p-channel bipolar junction transistor and the emitter of the first transistor is connected to the emitter of the second transistor;
the power switching device is either BJTs or MOSFETs;
at least one of the charge storage elements is a capacitor;
at least one of the resistive elements is a resistor;
at least one of the unidirectional current elements is a diode;
the transformer is an isolated transformer, and
signals to the primary winding of the transformer is PWM complementary, synchronous, or both.

8. The gate driver apparatus of claim 1, wherein:
the DC-offset producing circuit comprises:
  a first charge storage element, connected from a first side of the storage element to a first end of the secondary winding;
  a second charge storage element connected from a first side of the storage element to a second end of the secondary winding; and
  a second unidirectional current element connected between the center tap of the secondary winding and the second side of the second charge storage element, wherein current flows through the second unidirectional current element from the center tap to the second charge storage element;
the pull-up-pull-down circuit comprises:
  the first and the second complementary transistor connected from a first side together, in series, wherein:
    the first transistor is connected from a second side of the transistor to a first end of a first resistive element;
    a second end of the first resistive element is connected to a power supply voltage;
    the second transistor is connected from a second side of the transistor to ground; and
    a third charge storage element is connected between the second side of the first resistive element and the second side of the second transistor;
the feedback circuit comprises:
  a second resistive element and a third unidirectional current element connected in series from the gates of the first and the second transistors to the first end of the secondary winding, wherein current flows toward the first end of the secondary winding; and
a configuration wherein:
  the gate of the power switching device is connected to the connection point of the first and the second transistors and to the second side of the second charge storage element; and
  a third resistive element is connected from a first side of the resistive element to the second side of the first charge storage element and from a second side of the resistive element to the gates of the first and the second transistors.

9. The gate driver apparatus of claim 8, wherein:
the secondary winding of the transformer has a center tap;
the first transistor is an n-channel bipolar junction transistor and the second transistor is a p-channel bipolar junction transistor and the emitter of the first transistor is connected to the emitter of the second transistor;
the power switching device is either BJTs or MOSFETs;
at least one of the charge storage elements is a capacitor;
at least one of the resistive elements is a resistor;
at least one of the unidirectional current elements is a diode;
the transformer is an isolated transformer, and
signals to the primary winding of the transformer is PWM complementary, synchronous, or both.

10. The gate driver apparatus of claim 1, wherein:
the DC-offset producing circuit comprises:
  a first charge storage element, connected from a first side of the storage element to a first end of the secondary winding;

the pull-up-pull-down circuit comprises:
the first and the second complementary transistor connected from a first side together, in series, wherein:
the first transistor is connected from a second side of the transistor to a first end of a first resistive element;
a second end of the first resistive element is connected to a power supply voltage;
the second transistor is connected from a second side of the transistor to ground; and
a third charge storage element is connected between the second side of the first resistive element and the second side of the second transistor;
the feedback circuit comprises:
a second resistive element and a third unidirectional current element connected in series from the gates of the first and the second transistors to the first end of the secondary winding, wherein current flows toward the first end of the secondary winding; and
a configuration wherein:
the gate of the power switching device is connected to the connection point of the first and the second transistors and to a second end of the secondary winding; and
a third resistive element is connected from a first side of the resistive element to the second side of the first charge storage element and from a second side of the resistive element to the gates of the first and the second transistors.

11. The gate driver apparatus of claim 10, wherein:
the secondary winding of the transformer has a center tap;
the first transistor is an n-channel bipolar junction transistor and the second transistor is a p-channel bipolar junction transistor and the emitter of the first transistor is connected to the emitter of the second transistor;
the power switching device is either BJTs or MOSFETs;
at least one of the charge storage elements is a capacitor;
at least one of the resistive elements is a resistor;
at least one of the unidirectional current elements is a diode;
the transformer is an isolated transformer, and
signals to the primary winding of the transformer is PWM complementary, synchronous, or both.

12. The gate driver apparatus of claim 1, wherein:
the secondary winding of the transformer has a center tap;
the first transistor is an n-channel bipolar junction transistor and the second transistor is a p-channel bipolar junction transistor and the emitter of the first transistor is connected to the emitter of the second transistor;
the power switching device is either BJTs or MOSFETs;
at least one of the charge storage elements is a capacitor;
at least one of the resistive elements is a resistor;
at least one of the unidirectional current elements is a diode;
the transformer is an isolated transformer, and
signals to the primary winding of the transformer is PWM complementary, synchronous, or both.

13. The gate driver apparatus of claim 1, wherein the transformer has two secondary windings with center taps and each of the two secondary windings feeds one gate driver circuit and controls one of two switching devices of a half-bridge, and wherein the pull-up-pull-down circuit of one of the two gate driver circuits is connected from one side to a power supply, through a unidirectional current element, and from another side to a load, and wherein the pull-up-pull-down circuit of the other of the two gate driver circuits is connected from one side to the load and from another side to ground.

14. The gate driver apparatus of claim 13, wherein two same or two different gate driver circuits control the two switching devices of a half-bridge, and wherein the switching devices are MOSFET or IGBT (insulated gate bipolar transistor).

15. The gate driver apparatus of claim 13, wherein the transformer has four secondary windings and each two secondary windings are utilized to feed two gate driver circuits and control one half-bridge powering the load, and wherein together the four secondary windings control one full-bridge.

16. A driver circuit for alternately driving a half- or a full-bridge, capable of operating in a wide range of duty cycles, the driver circuit comprising:
means for transforming a time varying signal to another time varying signal with different attributes;
means for DC-offsetting a transistor gate control signal, wherein the DC-offsetting means causes fast turn-on and turn-off of a transistor;
means for pulling-up or pulling-down a transistor gate;
means for feeding back a transistor gate control signal to the means for DC-offsetting, wherein the feedback means speeds up transistor operations; and
a configuration wherein the pull-up-pull-down means controls the gate of a power switching device.

17. The driver circuit of claim 16, wherein the transforming means has two secondary windings and each of the two secondary windings feeds one driver circuit and controls one of two switching devices of a half-bridge, and wherein the pull-up-pull-down means of one of the two driver circuits is connected from one side to a power supply, through a bootstrap diode, and from another side to a load, and wherein the pull-up-pull-down means of the other of the two driver circuits is connected from one side to the load and from another side to ground.

18. The driver circuit of claim 17, wherein only one power supply is required for the gate drivers of half- or full-bridge with a bootstrap circuit for a top switch MOSFET.

19. The driver circuit of claim 17, wherein the transforming means has four secondary windings and each two secondary windings are utilized to feed two driver circuits and control one half-bridge powering the load, and wherein together the four secondary windings control one full-bridge.

20. A method for alternately driving a half- or a full-bridge, capable of operating in a wide range of duty cycles, the method comprising:
transforming a time varying input signal to another time varying signal, using at least one isolated transformer;
DC-offsetting a transistor gate control signal for fast turn-on and turn-off of transistors;
pulling-up or pulling-down a transistor-switch gate by a pull-up-pull-down circuit;
feeding back a pull-up-pull-down control signal to speed up transistor operations; and
controlling the gate of a power switching device by the pull-up-pull-down operation.

21. The method of claim 20, wherein the transforming is performed by one transformer that has two secondary windings and one primary winding, or by two separate transformers each with one secondary winding and one primary winding, and wherein each of the two secondary windings is used to drive and control one of two switching devices of a half-bridge.

22. The method of claim 21, wherein the transforming is performed by one transformer that has four secondary windings and one primary winding and each two secondary windings are utilized to control one half-bridge, and wherein together the four secondary windings control one full-bridge.

* * * * *